US009190578B2

(12) United States Patent
Cho et al.

(10) Patent No.: US 9,190,578 B2
(45) Date of Patent: Nov. 17, 2015

(54) LAMP UNIT

(71) Applicant: LG INNOTEK CO., LTD., Seoul (KR)

(72) Inventors: Yun Min Cho, Seoul (KR); In Yong Park, Seoul (KR); Gun Kyo Lee, Seoul (KR); Jong Woo Lee, Seoul (KR); Ju Young Lee, Seoul (KR); Seong Hoon Jang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/960,319

(22) Filed: Aug. 6, 2013

(65) Prior Publication Data

US 2014/0209947 A1  Jul. 31, 2014

(30) Foreign Application Priority Data

Jan. 29, 2013  (KR) .................. 10-2013-0009672

(51) Int. Cl.
*H01L 33/50* (2010.01)
*H01L 25/075* (2006.01)
*H01L 33/54* (2010.01)
*H01L 33/62* (2010.01)

(52) U.S. Cl.
CPC .......... *H01L 33/50* (2013.01); *H01L 25/0753* (2013.01); *H01L 33/54* (2013.01); *H01L 33/62* (2013.01); *H01L 2224/48091* (2013.01); *H01L 2224/8592* (2013.01)

(58) Field of Classification Search
CPC ...... H01L 25/0753; H01L 33/50; H01L 33/54; H01L 33/62
See application file for complete search history.

(56) References Cited

U.S. PATENT DOCUMENTS

| 2011/0220944 A1* | 9/2011 | Choi et al. ............... 257/98 |
| 2011/0222280 A1* | 9/2011 | Kim ........................ 362/235 |
| 2013/0322081 A1* | 12/2013 | Pan et al. .............. 362/249.02 |

* cited by examiner

*Primary Examiner* — Whitney T Moore
(74) *Attorney, Agent, or Firm* — KED & Associates LLP

(57) ABSTRACT

The lamp unit includes a first substrate, a second substrate provided over the first substrate, a light emitting device provided over the second substrate, a first conductive layer and a second conductive layer provided over the second substrate, and at least one wire electrically coupling at least one of the first conductive layer and the second conductive layer to each of the light emitting device. A protective layer is provided over the first substrate and the second substrate and surrounding the light emitting device and the at least one wire, and the upper surface of the protecting layer is located at a position above the highest point of the at least one wire.

20 Claims, 18 Drawing Sheets

LAMP UNIT

CROSS REFERENCE TO RELATED APPLICATION

This application claims priority under 35 U.S.C. §119 to Korean Patent Application No. 10-2013-0009672, filed in Korea on Jan. 29, 2013 which are hereby incorporated in its entirety by reference as if fully set forth herein.

TECHNICAL FIELD

Embodiments relate to a lamp unit and a vehicle lamp device.

BACKGROUND

In general, a lamp refers to an apparatus which supplies or adjusts light for a specific purpose. As a light source of lamps, an incandescent bulb, a fluorescent lamp, a neon lamp, etc. may be used, and a light emitting diode (LED) is used now.

The LED is a device that converts an electrical signal into infrared or visible light using compound semiconductor characteristics, and does not use harmful materials, such as mercury, differently from a fluorescent lamp, and thus scarcely cause environmental contamination. Further, the LED has a longer lifespan than an incandescent bulb, a fluorescent lamp, and a neon lamp. Further, as compared to an incandescent bulb, a fluorescent lamp, and a neon lamp, the LED has small power consumption, excellent visibility and low glare due to high color temperature thereof.

The above references are incorporated by reference herein where appropriate for appropriate teachings of additional or alternative details, features and/or technical background.

SUMMARY

The embodiments will be described in detail with reference to the following drawings in which like reference numerals refer to like elements wherein:

Embodiments provide a lamp unit which protects wires bonded to light emitting device and reduces light loss.

In one embodiment, a lamp unit includes a first substrate, a second substrate disposed on the first substrate, a light emitting device disposed on the second substrate, a first conductive layer and a second conductive layer disposed on the second substrate, at least one wire electrically connecting at least one of the first conductive layer and the second conductive layer to the light emitting device, and a protecting layer disposed on the first substrate and the second substrate so as to surround the light emitting device and the at least one wire, wherein the upper surface of the protecting layer is located at a position higher than the highest point of the at least one wire.

The protecting layer may be formed of a molding member reflecting light.

The protecting layer may be formed of a light-transmitting molding member.

The protecting layer may contact the side surface of the light emitting device.

The upper surface of the light emitting device may be coplanar with the upper surface of the protecting layer.

The upper surface of the light emitting device may be exposed from the protecting layer.

The light emitting device may include a light emitting structure including a first semiconductor layer, an active layer and a second semiconductor layer, and generating light, and a wavelength conversion layer disposed on the light emitting structure and converting the wavelength of light irradiated from the light emitting structure.

The first substrate may be provided with a cavity, the second substrate may be disposed within the cavity, and the protecting layer may fill the cavity.

The lamp unit may further include a third conductive layer and a fourth conductive layer disposed on the first substrate, first wires electrically connecting the first conductive layer to the third conductive layer, and second wires electrically connecting the second conductive layer to the fourth conductive layer, and the protecting layer may surround the first wires and the second wires.

The lamp unit may further include lenses corresponding to the light emitting device and disposed on the protecting layer.

The first substrate may be a metal core printed circuit board (MCPCB), and the second substrate may be a ceramic substrate.

In another embodiment, a lamp unit includes a first substrate, a second substrate disposed on the first substrate, a light emitting device disposed on the second substrate, a first conductive layer and a second conductive layer disposed on the second substrate, at least one wire electrically connecting at least one of the first conductive layer and the second conductive layer to the light emitting device, a wavelength conversion layer disposed on the light emitting device and converting the wavelength of light irradiated by the light emitting device, and a protecting layer disposed on the first substrate and the second substrate so as to surround the light emitting device and the at least one wire, wherein the upper surface of the protecting layer is located at a position higher than the highest point of the at least one wire.

The upper surface of the wavelength conversion layer may be located at a position higher than the highest point of the at least one wire.

The protecting layer may be formed of a molding member reflecting light.

The protecting layer may be formed of a light-transmitting molding member.

The protecting layer may contact the side surface of the light emitting device and the side surface of the wavelength conversion layer.

The upper surface of the wavelength conversion layer may be exposed from the protecting layer.

The light emitting device may include a light emitting structure including a first semiconductor layer, an active layer, and a second semiconductor layer, and generating light, and the light emitting device may emit one of blue light, green light, red light, and yellow light.

The lamp unit may further include lenses corresponding to the light emitting device and disposed on the protecting layer and the wavelength conversion layer.

The light emitting device may be plural in number, and the plural light emitting devices may be separated from one another.

The wavelength conversion layer may include plural portions, and each of the plural portions of the wavelength conversion layer may be located so as to correspond to one of the plural light emitting devices.

The wavelength conversion layer may be located so as to correspond to regions in which the plural light emitting devices are respectively located and regions located between two neighboring light emitting devices.

The lamp unit may further include a molding fixation unit disposed on the first substrate so as to contact the outer circumferential surface of the protecting layer, and supporting the edge of the protecting layer.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
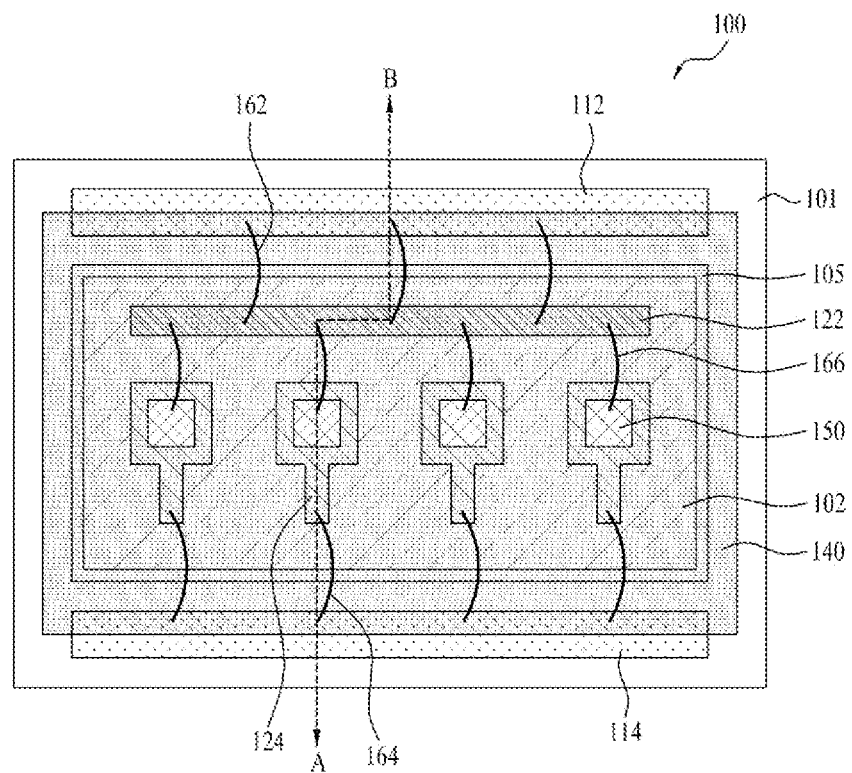
FIG. 1 is a plan view of a lamp unit in accordance with one embodiment.

Hereinafter, embodiments will be described with reference to the annexed drawings. It will be understood that when an element is referred to as being 'on' or "under" another element, it can be directly on/under the element and one or more intervening elements may also be present. When an element is referred to as being 'on' or 'under', 'under the element' as well as 'on the element' can be included based on the element. Further, a criterion for being on or under each element is judged based on the drawings.

In the drawings, sizes may be exaggerated, omitted, or schematically illustrated for convenience and clarity of description. Further, the sizes of the respective elements do not represent actual sizes thereof. Further, in the drawings, the same or similar elements are denoted by the same reference numerals even though they are depicted in different drawings. Hereinafter, a lamp unit and a lamp device for vehicles having the same in accordance with embodiments will be described with reference to the accompanying drawings.

Figure 2:
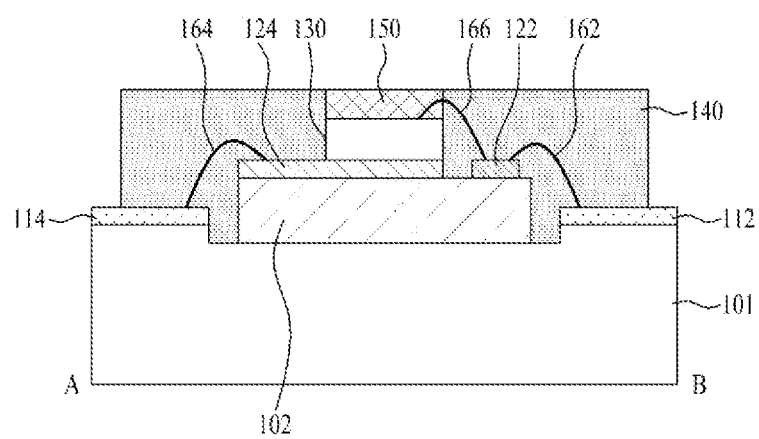
FIG. 2 is a cross-sectional view of the lamp unit shown in FIG. 1 taken along the line A-B.

FIG. 1 is a plan view of a lamp unit 100 in accordance with one embodiment, and FIG. 2 is a cross-sectional view of the lamp unit 100 shown in FIG. 1 taken along the line A-B.

With reference to FIGS. 1 and 2, the lamp unit 100 includes a first substrate 101, a second substrate 102, plural conductive layers 112, 114, 122 and 124, light emitting device 130, a protecting layer 140, a wavelength conversion layer 150, and plural wires 162, 164 and 166.

The second substrate 102 may be disposed on the first substrate 101, and the area of the second substrate 102 may be smaller than the area of the first substrate 101. In accordance with another embodiment, the area of the second substrate 102 may be equal to the area of the first substrate 101.

The first substrate 101 may be a substrate having first thermal conductivity, the second substrate 102 may be a substrate having second thermal conductivity, and the first thermal conductivity may be greater than the second thermal conductivity. This serves to rapidly dissipate heat generated from light emitting device 130 disposed on the second substrate 102 to the outside through the first substrate 101.

The first substrate 101 may be a metal substrate, for example, a metal core printed circuit board (MCPCB). The first substrate 101 is a heat dissipation plate having high thermal conductivity, and may be formed of one selected from the group consisting of copper (Cu), aluminum (Al), silver (Ag), and gold (Au), or an alloy thereof.

The second substrate 102 may be an insulating substrate, for example, a ceramic substrate having high thermal conductivity. The second substrate 102 may be formed of a nitride, for example, AlN. Otherwise, the second substrate 102 may include an anodized layer.

The first substrate 101 and the second substrate 102 may be formed in various shapes.

In accordance with one embodiment, the first substrate 101 may be provided with a cavity 105 formed in a designated region thereof, and the second substrate 102 may be disposed within the cavity 105 of the first substrate 101. Here, the first substrate 101 may include at least one of Al, Cu, and Au, and the second substrate 102 may include AlN.

In accordance with another embodiment, the first substrate 101 and the second substrate 102 may be sequentially laminated to form a laminated structure. Here, the first substrate 101 may include at least one of Al, Cu, and Au, and the second substrate 102 may include an anodized layer.

In accordance with another embodiment, the first substrate 101 and the second substrate 102 may be formed of the same material. Here, the first substrate 101 and the second substrate 102 may include at least one of AlN, Al, Cu, and Au.

The upper surface of the second substrate 102 on which the light emitting device 130 is disposed may be formed as a flat surface or a curved surface, such as a concave surface or a convex surface. Otherwise, the upper surface of the second substrate 102 may be formed in a shape in which at least two of a concave surface, a convex surface, and a flat surface are combined.

The third conductive layer 112 and the fourth conductive layer 114 may be disposed on the first substrate 101 such that they are separated from each other. The first substrate 101 may include a first circuit pattern including the third conductive layer 112 and the fourth conductive layer 114. The third conductive layer 112 and the fourth conductive layer 114 are not limited to the shape shown in FIG. 1 and may have a variety of shapes.

The first conductive layer 122 and the second conductive layer 124 may be disposed on the second substrate 102 such that they are separated from each other. The second substrate 102 may include a second circuit pattern including the first conductive layer 122 and the second conductive layer 124.

The light emitting device 130 is disposed on the second substrate 102. The number of the light emitting device 130 may be 1 or more. For example, as shown by FIG. 1, the light emitting device 130 may be plural in number and the plural light emitting devices as shown by FIG. 1 may be disposed on the second substrate 102 such that they are separated from one another.

Conductive layer 124 may be plural in number and separated from one another. However, the disclosure is not limited thereto, and only one connected conductive layer may be formed.

Although FIG. 1 illustrates one first conductive layer 122, the disclosure is not limited thereto, and plural first conductive layers separated from one another may be disposed and wires 166 may be bonded to the respective first conductive layers.

Figure 28:
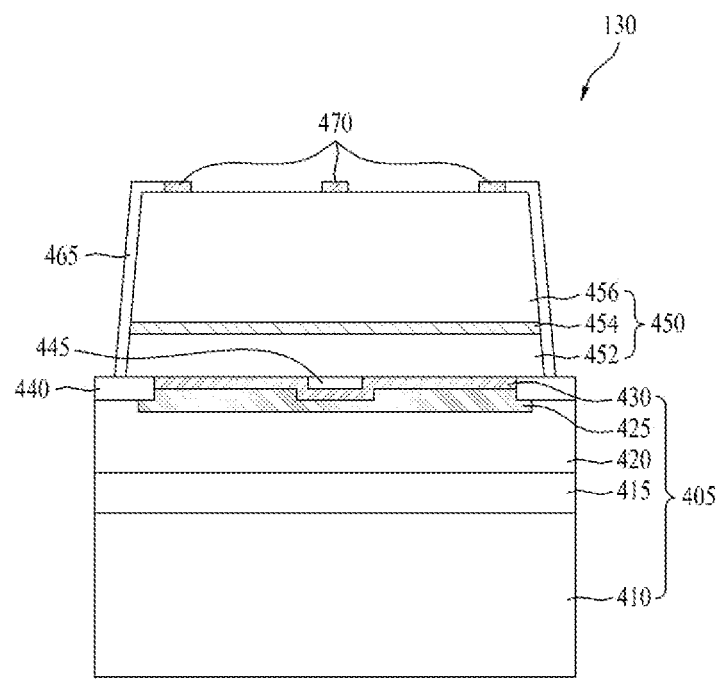
FIG. 28 is a view illustrating one embodiment of a light emitting device shown in FIG. 1.

FIG. 28 is a view illustrating one embodiment of the light emitting device 130 shown in FIG. 1.

With reference to FIG. 28, the light emitting device 130 includes a second electrode 405, a protective layer 440, a current blocking layer 445, a light emitting structure 450, a passivation layer 465, and a first electrode 470. For example, the light emitting device 130 may be formed as a light emitting diode chip.

The second electrode 405 together with the first electrode 470 provides power to the light emitting structure 450. The second electrode 405 may include a support layer 410, a bonding layer 415, a barrier layer 420, a reflective layer 425, and an ohmic layer 430.

The support layer 410 supports the light emitting structure 450. The support layer 410 may be formed of a metal or a semiconductor material. Further, the support layer 410 may be formed of a material having high electrical conductivity and high thermal conductivity. For example, the support layer 410 may be formed of a metal material including at least one selected from the group consisting of copper (Cu), a Cu alloy, gold (Au), nickel (Ni), molybdenum (Mo), and copper-tungsten (Cu—W), or a semiconductor including at least one selected from the group consisting of Si, Ge, GaAs, ZnO, and SiC.

The bonding layer 415 may be disposed between the support layer 410 and the barrier layer 420 and serve to bond the support layer 410 and the barrier layer 420. The bonding layer 415 may include at least one selected from the group consisting of metals, for example, In, Sn, Ag, Nb, Pd, Ni, Au, and Cu. Since the bonding layer 415 serves to form the support layer 410 through a bonding method, if the support layer 410 is formed through a plating or deposition method, the bonding layer 415 may be omitted.

The barrier layer 420 may be disposed under the reflective layer 425, the ohmic layer 430, and the protective layer 440, and prevent metal ions of the bonding layer 415 and the support layer 410 from diffusing into the light emitting structure 450 via the reflective layer 425 and the ohmic layer 430. For example, the barrier layer 420 may include at least one selected from the group consisting of Ni, Pt, Ti, W, V, Fe, and Mo, and be formed in a monolayer or multilayer structure.

The reflective layer 425 may be disposed on the barrier layer 420. The reflective layer 425 may reflect light incident from the light emitting structure 450, and thus improve light extraction efficiency. The reflective layer 425 may be formed of a light reflecting material, for example, at least one metal selected from the group consisting of Ag, Ni, Al, Rh, Pd, Ir, Ru, Mg, Zn, Pt, Au, and Hf, or an alloy thereof.

The reflective layer 425 may be formed in a multilayer structure using a metal or an alloy and a light-transmitting conductive material, such as IZO, IZTO, IAZO, IGZO, IGTO, AZO, or ATO. For example, the reflective layer 425 may be formed of IZO/Ni, AZO/Ag, IZO/Ag/Ni, or AZO/Ag/Ni.

The ohmic layer 430 may be disposed between the reflective layer 425 and the second semiconductor layer 452, and come into ohmic contact with the second semiconductor layer 452 so as to effectively provide power to the light emitting structure 450.

The ohmic layer 430 may be formed by selectively using a light-transmitting conductive layer and a metal. For example, the ohmic layer 430 may be formed of a metal coming into ohmic contact with the second semiconductor layer 452, for example, at least one selected from the group consisting of Ag, Ni, Cr, Ti, Pd, Ir, Sn, Ru, Pt, Au, and Hf.

The protective layer 440 may be disposed on the edge region of the second electrode layer 405. For example, the protective layer 440 may be disposed on the edge region of the ohmic layer 430, the edge region of the reflective layer 425, the edge region of the barrier layer 420, or the edge region of the support layer 410.

The protective layer 440 may prevent lowering of reliability of the light emitting device 130 due to debonding at the interface between the light emitting structure 450 and the second electrode layer 405. The protective layer 440 may be formed of an electrically insulating material, for example, ZnO, $SiO_2$, $Si_3N_4$, $TiO_x$ (x being a positive real number), or $Al_2O_3$.

The current blocking layer 445 may be disposed between the ohmic layer 430 and the light emitting structure 450. The upper surface of the current blocking layer 445 may contact the second semiconductor layer 452, and the lower surface or the lower and side surfaces of the current blocking layer 445 may contact the ohmic layer 430. The current blocking layer 445 may be disposed so as to at least partially overlap with the first electrode 470 in the vertical direction.

The current blocking layer 445 may be formed between the ohmic layer 430 and the second semiconductor layer 452 or formed between the reflective layer 425 and the ohmic layer 430, but the disclosure is not limited thereto.

The light emitting structure 450 may be disposed on the ohmic layer 430 and the protective layer 440. The side surface of the light emitting structure 450 may be inclined during an isolation etching process for dividing the light emitting structure 450 into unit chips. The light emitting structure 450 may include the second semiconductor layer 452, an active layer 454, and a first semiconductor layer 456, and generate light.

The second semiconductor layer 452 may be formed of a group III-V or II-VI compound semiconductor, and be doped with a second conductivity-type dopant. For example, the second semiconductor layer 451 may be formed of a semiconductor having a composition formula of $In_xAl_yGa_{1-x-y}N$ ($0 \leq x \leq 1$, $0 \leq y \leq 1$, $0 \leq x+y \leq 1$), and be doped with a P-type dopant (for example, Mg, Zn, Ca, Sr, or Ba).

The active layer 454 may generate light by energy released through recombination of electrons and holes provided from the first semiconductor layer 456 and the second semiconductor layer 452.

The active layer 454 may be formed of a semiconductor compound, for example, a group III-V or II-VI compound semiconductor, and be formed in a single well structure, a multi-well structure, a quantum-wire structure, or a quantum dot structure. If the active layer 454 is formed in a quantum well structure, the active layer 454 may have a single or multi-quantum well structure having a well layer having a composition formula of $In_xAl_yGa_{1-x-y}N$ ($0 \leq x \leq 1$, $0 \leq y \leq 1$, $0 \leq x+y \leq 1$) and a barrier layer having a composition formula of $In_aAl_bGa_{1-a-b}N$ ($0 \leq a \leq 1$, $0 \leq b \leq 1$, $0 \leq a+b \leq 1$). The well layer may be formed of a material having an energy bandgap lower than the energy bandgap of the barrier layer.

The first semiconductor layer 456 may be formed of a group III-V or II-VI compound semiconductor, and be doped with a first conductivity-type dopant. For example, the first semiconductor layer 456 may be formed of a semiconductor having a composition formula of $In_xAl_yGa_{1-x-y}N$ ($0 \leq x \leq 1$, $0 \leq y \leq 1$, $0 \leq x+y \leq 1$), and be doped with an N-type dopant (for example, Si, Ge, Sn, Se, or Te).

The light emitting device 130 may emit one of blue light, red light, green light, and yellow light according to the compositions of the first semiconductor layer 456, the active layer 454, and the second semiconductor layer 452 of the light emitting structure 450.

The passivation layer 465 may be disposed on the side surface of the light emitting structure 450 so as to electrically protect the light emitting structure 450. The passivation layer 465 may be disposed on a portion of the upper surface of the first semiconductor layer 455 or the upper surface of the protective layer 440. The passivation layer 465 may be formed of an insulating material, for example, $SiO_2$, $SiO_x$, $SiO_xN_y$, $Si_3N_4$, or $Al_2O_3$.

The first electrode 470 may be disposed on the first semiconductor layer 456. The first electrode 470 may be formed in a designated pattern. The first electrode 470 may include a pad part for wire-bonding, and branched finger electrodes (not shown) extending from the pad part.

In order to increase light extraction efficiency, a roughness pattern (not shown) may be formed on the upper surface of the first semiconductor layer 456. Further, in order to increase light extraction efficiency, a roughness pattern (not shown) may be also formed on the upper surface of the first electrode 470.

The light emitting device 130 may be electrically connected to the first conductive layer 122 and the second conductive layer 124. When the light emitting device 130 is plural in number, the plural light emitting devices as shown by FIG. 1 are electrically connected to the first conductive layer 122 and the second conductive layer 124.

The second electrode 405 of the light emitting device 130 may be bonded to the second conductive layer 124 disposed on the second substrate 102 by eutectic bonding or die bonding, and be thus electrically connected to the second conductive layer 124.

The wire 166 may electrically connect the first electrode 470 of the light emitting device 130 to the first conductive layer 122 disposed on the second substrate 102. The number of the wire 166 may be 1 or more.

The wire 162 may electrically connect the first conductive layer 122 disposed on the second substrate 102 to the third conductive layer 112 disposed on the first substrate 101. The number of the wire 162 may be 1 or more.

The wire 164 may electrically connect the second conductive layer 124 disposed on the second substrate 102 to the fourth conductive layer 114 disposed on the first substrate 101. The number of the wire 164 may be 1 or more.

The wavelength conversion layer 150 is located on the light emitting device 130, and may convert the wavelength of light generated from the light emitting device 130. The wavelength conversion layer 150 may include a colorless and transparent polymer resin, such as epoxy or silicon, and phosphors. The wavelength conversion layer 150 may include at least one of a red phosphor, a green phosphor, and a yellow phosphor. The wavelength conversion layer 150 may partially surround the wire 166. When the wire 166 is plural in number as shown by FIG. 1, the wavelength conversion layer 150 may partially surround the plural wires.

The protecting layer 140 may be disposed on the first substrate 101 and the second substrate 102 so as to surround the light emitting device 130 and the wires 162 to 166. The protecting layer 140 may fill the cavity 105 of the first substrate 101. The upper surface of the protecting layer 140 may be located at a position higher than the highest point of the wires 166.

The protecting layer 140 may surround the wires 162 to 166, and prevent the wires 162 to 166 from being exposed to the outside or protruding to the outside. In this embodiment, the protecting layer 140 may prevent the wires (for example, the wires 166) from being broken or damaged due to impact or pressure or corroding due to air, and thus prevent breakage or malfunction of the light emitting device 130.

The protecting layer 140 may be formed of a non-conductive molding member which may reflect light, for example, white silicon, but the disclosure is not limited thereto.

Since the protecting layer 140 closely contacts the light emitting device 130 (for example, the plural light emitting devices in FIG. 1) and directly reflects light irradiated by the light emitting device 130 (for example, the plural light emitting devices in FIG. 1), the lamp unit 100 in accordance with this embodiment may reduce light loss caused by absorption or transmission of light by air or the first substrate 101 and the second substrate 102, and improve light emission efficiency.

Figure 3:
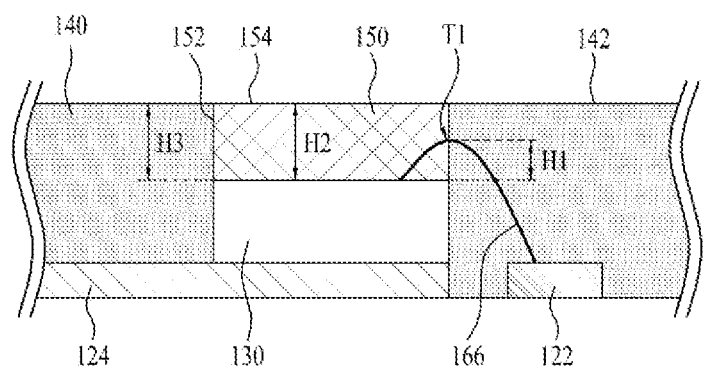
FIGS. 3 to 6 are enlarged views illustrating wavelength conversion layers and wires in accordance with embodiments.

FIG. 3 is an enlarged view illustrating a wavelength conversion layer 150 and a wire 166 in accordance with one embodiment.

With reference to FIG. 3, the protecting layer 140 may contact a side surface 152 of the wavelength conversion layer 150 and the side surface of the light emitting device 130, and surround the side surface 152 of the wavelength conversion layer 150.

An upper surface 154 of the wavelength conversion layer 150 may be flat, and be exposed from the protecting layer 140.

The upper surface 154 of the wavelength conversion layer 150 may be coplanar with an upper surface 142 of the protecting layer 140. A height H2 from the upper surface of the light emitting device 130 to the upper surface 154 of the wavelength conversion layer 150 may be equal to a height H3 from the upper surface of the light emitting device 130 to the upper surface 142 of the protecting layer 140 (H2=H3).

In order to protect the wire 166, the upper surface 154 of the wavelength conversion layer 150 and the upper surface 142 of the protecting layer 140 may be located at a position higher than the highest point T1 of the wire 166.

The height H2 from the upper surface of the light emitting device 130 to the upper surface 154 of the wavelength conversion layer 150 and the upper surface 142 of the protecting layer 140 may exceed at least 50 μm. The reason for this is that the lowest height H1 of the highest point T1 of the wire 166 which may be formed by a manufacturing process is about 50 μm. Therefore, if the height from the upper surface of the light emitting device 130 to the upper surface 154 of the wavelength conversion layer 150 and the upper surface 142 of the protecting layer 140 is less than 50 μm, the wire 166 may be exposed from the protecting layer 140.

The height H2 from the upper surface of the light emitting device 130 to the upper surface 154 of the wavelength conversion layer 150 may be greater than a height H1 from the upper surface of the light emitting device 130 to the highest point T1 of the wire 166 (H2>H1). This serves to prevent exposure of the wire 166.

Figure 4:
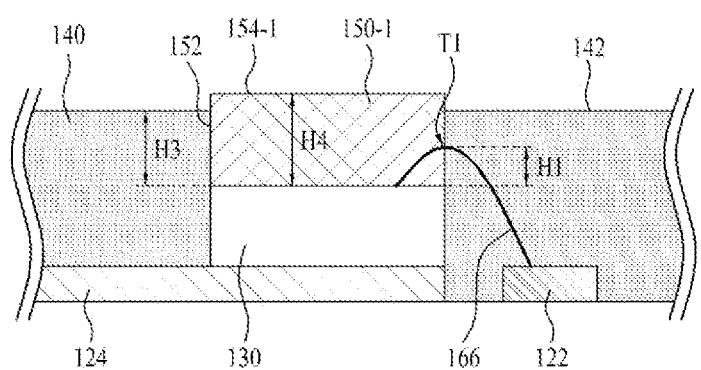

FIG. 4 is an enlarged view illustrating a wavelength conversion layer 150-1 and a wire 166 in accordance with another embodiment.

With reference to FIG. 4, an upper surface 154-1 of the wavelength conversion layer 150-1 may be higher than the upper surface 142 of the protecting layer 140. The upper surface 154-1 of the wavelength conversion layer 150-1 may protrude from the upper surface 142 of the protecting layer 140.

A height H4 from the upper surface of the light emitting device 130 to the upper surface 154-1 of the wavelength conversion layer 150-1 may be greater than the height H3 from the upper surface of the light emitting device 130 to the upper surface 142 of the protecting layer 140 (H4>H3).

Figure 5:
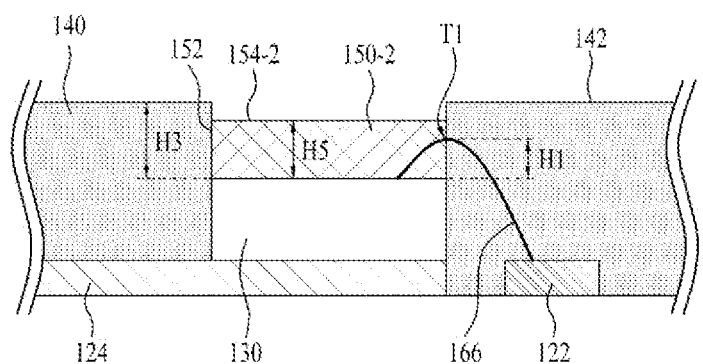

FIG. 5 is an enlarged view illustrating a wavelength conversion layer 150-2 and a wire 166 in accordance with another embodiment.

With reference to FIG. 5, an upper surface 154-2 of the wavelength conversion layer 150-2 may be lower than the upper surface 142 of the protecting layer 140. A height H5 from the upper surface of the light emitting device 130 to the upper surface 154-2 of the wavelength conversion layer 150-2 may be lower than the height H3 from the upper surface of the light emitting device 130 to the upper surface 142 of the protecting layer 140 and be greater than the height H1 of the highest point T1 of the wire 166 (H1<H5<H3).

Figure 6:
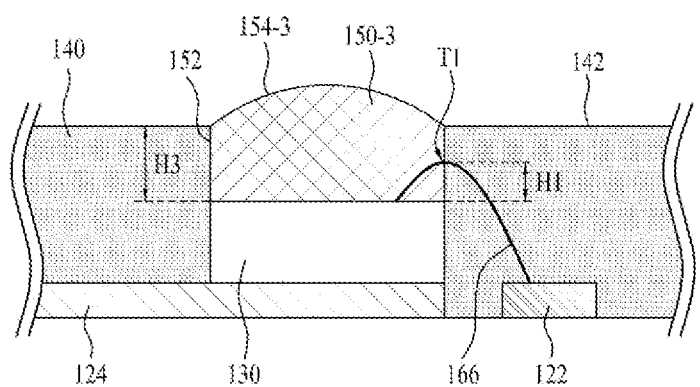

FIG. 6 is an enlarged view illustrating a wavelength conversion layer 150-3 and a wire 166 in accordance with another embodiment.

With reference to FIG. 6, an upper surface 154-3 of the wavelength conversion layer 150-3 may be curved. For example, the upper surface 154-3 of the wavelength conversion layer 150-3 may be formed in a dome shape or a hemispheric shape. Since the upper surface 154-3 of the wavelength conversion layer 150-3 is curved, in this embodiment, light irradiated from the light emitting device 130 may be refracted and thus orientation angle of light may be improved.

When the light emitting device 130 is plural in number, descriptions in FIGS. 3 to 6 may be equally applied to the plural light emitting devices in FIG. 1.

Figure 7:
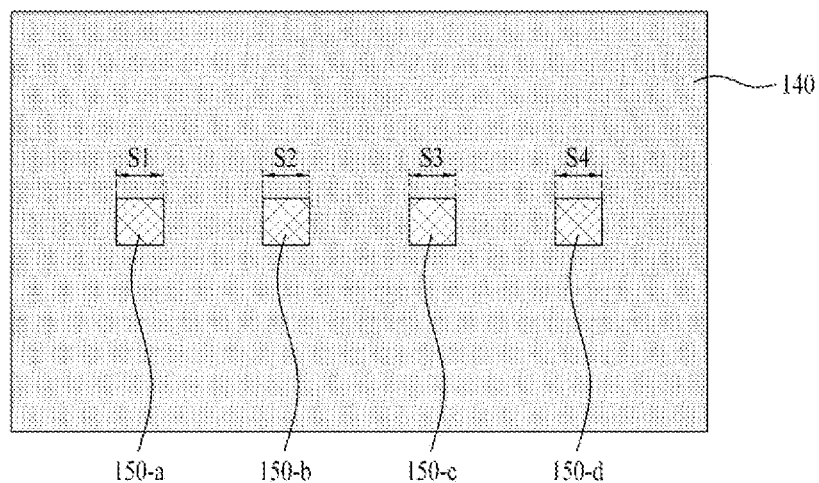
FIGS. 7 and 8 are views illustrating wavelength conversion layers in accordance with embodiments.

FIG. 7 is a view illustrating a wavelength conversion layer 150 in accordance with one embodiment.

With reference to FIG. 7, when the light emitting device 130 is plural in number, the wavelength conversion layer 150 may correspond to regions S1 to S4 in which the plural light emitting devices in FIG. 1 are respectively located. The wavelength conversion layer 150 may include plural portions (for example, 150-a, 150-b, 150-c, and 150-d) separated from one another, and these portions (for example, 150-a, 150-b, 150-c, and 150-d) may respectively correspond to the plural light emitting devices in FIG. 1.

Figure 8:
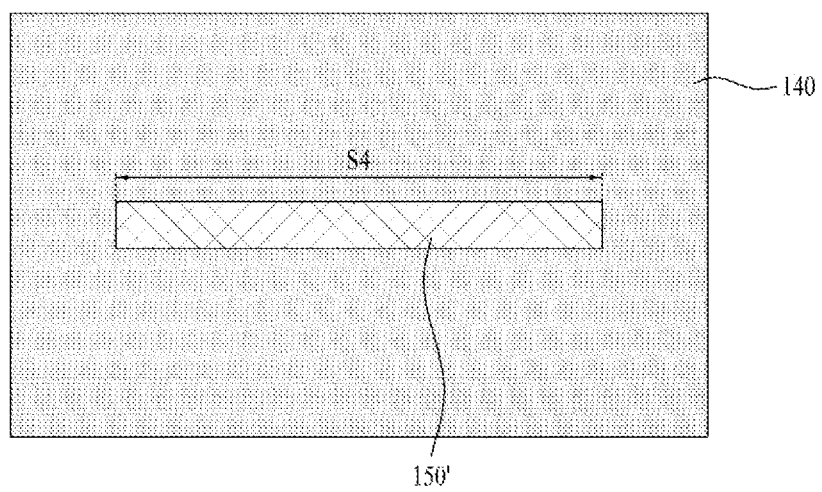

FIG. 8 is a view illustrating a wavelength conversion layer 150' in accordance with another embodiment.

With reference to FIG. 8, when the light emitting device 130 is plural in number, the wavelength conversion layer 150' may correspond to a region S5 formed by uniting regions in which the plural light emitting devices in FIG. 1 are respectively located and regions located between two neighboring light emitting devices in FIG. 1, and be formed in one body.

Figure 9:
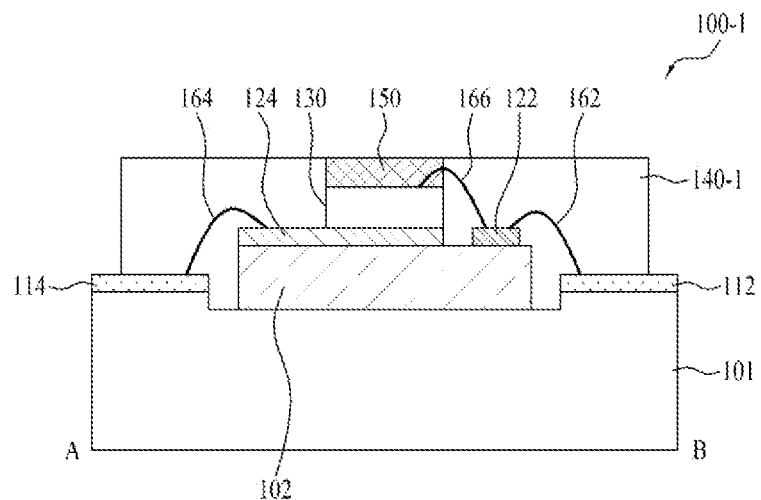
FIG. 9 is a cross-sectional view of a lamp unit in accordance with another embodiment.

FIG. 9 is a cross-sectional view of a lamp unit 100-1 in accordance with another embodiment. Elements in this embodiment which are substantially the same as those in the embodiment shown in FIG. 2 are denoted by the same reference numerals even though they are depicted in different drawings, and a detailed description thereof will thus be briefly given or omitted because it is considered to be unnecessary.

With reference to FIG. 9, the lamp unit 100-1 in accordance with this embodiment differs from the lamp unit 100 in accordance with the embodiment shown in FIG. 2 in that the lamp unit 100-1 includes a light-transmitting protecting layer 140-1.

That is, the protecting layer 140-1 may be formed of a non-conductive molding member which may transmit light. For example, the protecting layer 140-1 may be formed of silicon resin, epoxy resin, glass, glass ceramic, polyester resin, acrylic resin, urethane resin, nylon resin, polyamide resin, polyimide resin, vinyl chloride resin, polycarbonate resin, polyethylene resin, Teflon resin, polystyrene resin, polypropylene resin, or polyolefin resin.

The protecting layer 140-1 shown in FIG. 9 is the same as the protecting layer 140 in the embodiment shown in FIG. 2 except for the material of the protecting layer 140-1.

Figure 10:
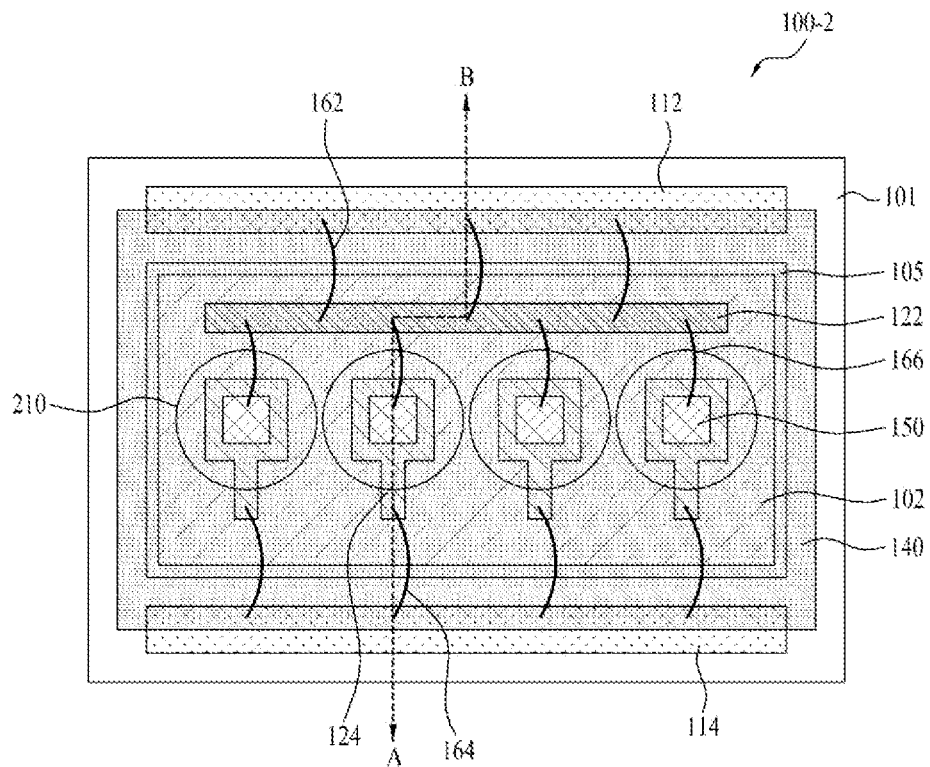
FIG. 10 is a plan view of a lamp unit in accordance with another embodiment.
Figure 11:
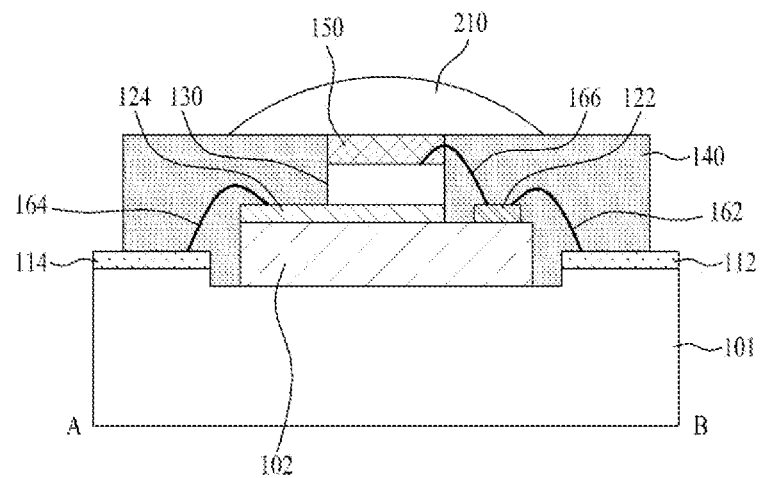
FIG. 11 is a cross-sectional view of the lamp unit shown in FIG. 10 taken along the line A-B.

FIG. 10 is a plan view of a lamp unit 100-2 in accordance with another embodiment, and FIG. 11 is a cross-sectional view of the lamp unit 100-2 shown in FIG. 10 taken along the line A-B. Elements in this embodiment which are substantially the same as those in the embodiment shown in FIG. 2 are denoted by the same reference numerals even though they are depicted in different drawings, and a detailed description thereof will thus be briefly given or omitted because it is considered to be unnecessary.

With reference to FIGS. 10 and 11, the lamp unit 100-2 further includes lenses 210, in addition to the lamp unit 100 in accordance with the embodiment shown in FIG. 2.

The lenses 210 may be disposed on the wavelength conversion layer 150 and the protecting layer 140 so as to correspond to the light emitting device 130. The lenses 210 may refract light irradiated by the corresponding light emitting device 130, and adjust a light path of the lamp unit 100-2.

Although FIG. 10 illustrates the lenses 210 as corresponding to the respective light emitting devices in FIG. 10, when the light emitting device 130 is plural in number, one lens (not shown) covering all the light emitting devices in FIG. 10 may be provided.

Figure 12:
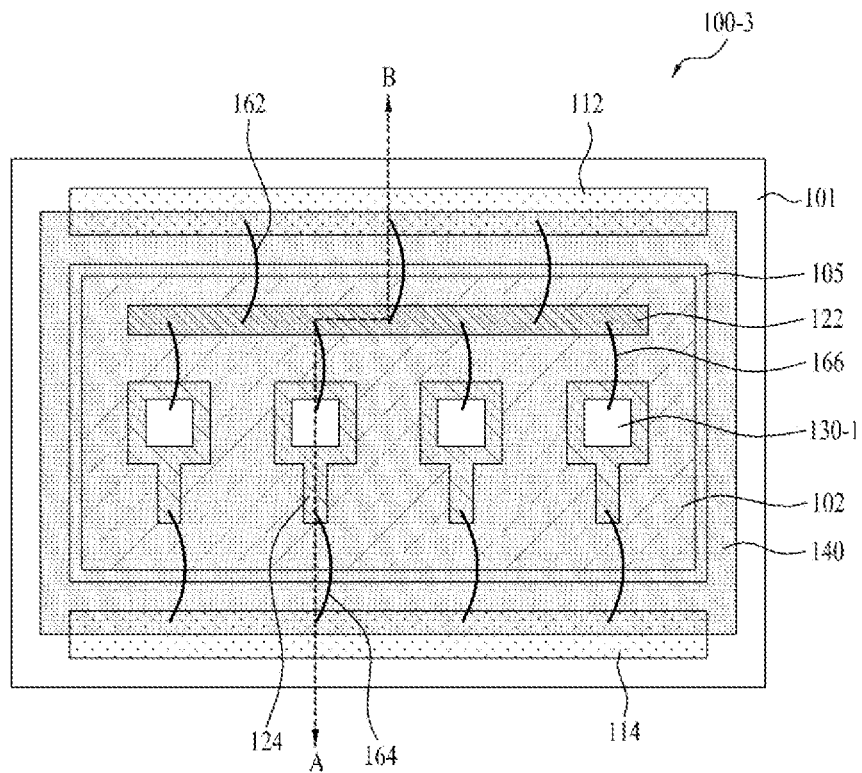
FIG. 12 is a plan view of a lamp unit in accordance with another embodiment.
Figure 13:
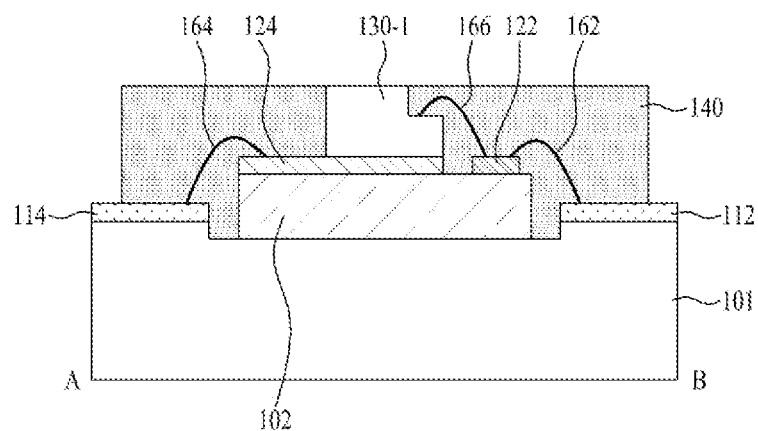
FIG. 13 is a cross-sectional view of the lamp unit shown in FIG. 12 taken along the line A-B.

FIG. 12 is a plan view of a lamp unit 100-3 in accordance with another embodiment, and FIG. 13 is a cross-sectional view of the lamp unit 100-3 shown in FIG. 12 taken along the line A-B. Elements in this embodiment which are substantially the same as those in the embodiment shown in FIG. 2 are denoted by the same reference numerals even though they are depicted in different drawings, and a detailed description thereof will thus be briefly given or omitted because it is considered to be unnecessary.

With reference to FIGS. 12 and 13, the lamp unit 100-3 includes a first substrate 101, a second substrate 102, plural conductive layers 112, 114, 122, and 124, light emitting device 130-1, a protecting layer 140, and plural wires, 162, 164, and 166.

With reference to FIGS. 12 and 13, while the lamp unit 100 in the embodiment shown in FIG. 2 includes the chip-type light emitting device 130 and the wavelength conversion layer 150 located on the light emitting device 130, the lamp unit 100-includes the light emitting device 130-1, each of which is formed into one chip including the light emitting device 130 and the wavelength conversion unit 150 of the lamp unit 100 in the embodiment shown in FIG. 2.

For example, the light emitting device 130 may emit one of blue light, green light, red light, and yellow light, and the light emitting device 130-1 may emit white light.

Figure 29:
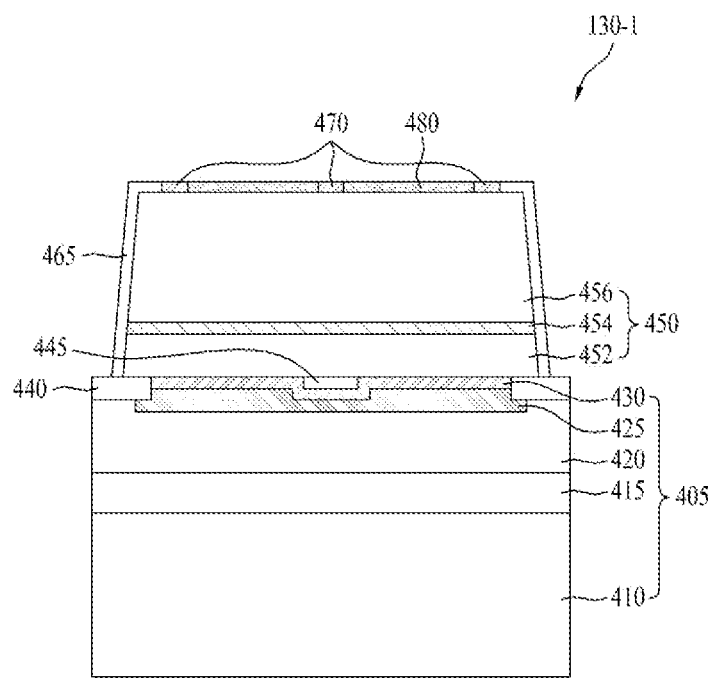
FIG. 29 is a view illustrating one embodiment of a light emitting device shown in FIG. 13.

FIG. 29 is a view illustrating one embodiment of the light emitting device 130-1 shown in FIG. 13. Elements in this embodiment which are substantially the same as those in the embodiment shown in FIG. 28 are denoted by the same reference numerals even though they are depicted in different drawings, and a detailed description thereof will thus be briefly given or omitted because it is considered to be unnecessary.

With reference to FIG. 29, the light emitting device 130-1 further includes a wavelength conversion layer 480.

The wavelength conversion layer 480 may be disposed on the first semiconductor layer 456, and expose the first electrode 470.

For example, the wavelength conversion layer 480 may be formed of a mixture of a colorless and transparent polymer resin, such as epoxy or silicon, and phosphors. The wavelength conversion layer 480 may be formed by conformal coating of the first semiconductor layer 456 with the mixture of polymer resin and phosphors. In order to perform wire-bonding, the wavelength conversion layer 480 may expose a pad part (not shown) of the first electrode 470.

The upper surface of the protecting layer 140 may be located at a position higher than the highest point of the wires 166 bonded to the first conductive layer 122 disposed on the second substrate 102. The protecting layer 140 may surround the wires 162 to 166, and prevent the wires 162 to 166 from being exposed to the outside or protruding to the outside.

The protecting layer 140 may contact the side surface of the light emitting device 130-1, and the upper surface of the light emitting device 130-1 may be exposed from the protecting layer 140.

The upper surface of the protecting layer 140 may be coplanar with the upper surface of the light emitting device 130-1. That is, the height of the upper surface of the light emitting device 130-1 may be the same as the upper surface of the protecting layer 140. Here, the upper surface of the light emitting device 130-1 may be the upper surface of the wavelength conversion layer 480.

Figure 14:
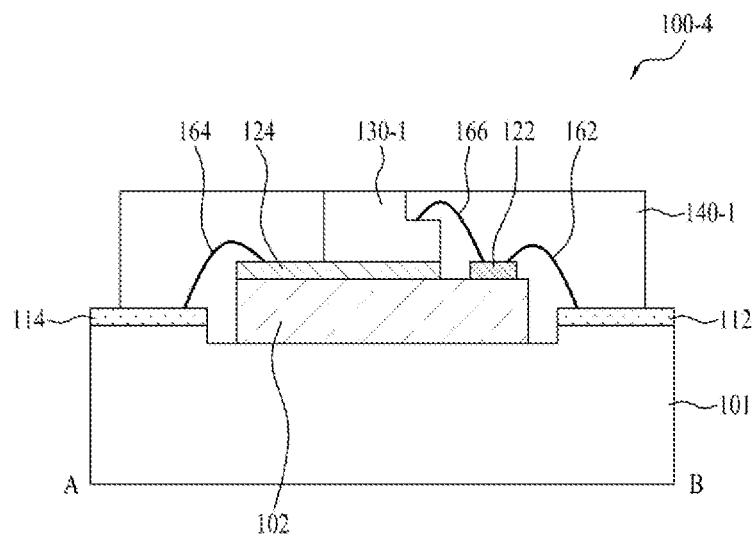
FIG. 14 is a cross-sectional view of a lamp unit in accordance with another embodiment.

FIG. 14 is a cross-sectional view of a lamp unit 100-4 in accordance with another embodiment. Elements in this embodiment which are substantially the same as those in the embodiment shown in FIG. 13 are denoted by the same reference numerals even though they are depicted in different drawings, and a detailed description thereof will thus be briefly given or omitted because it is considered to be unnecessary.

With reference to FIG. 14, the lamp unit 100-4 differs from the lamp unit 100-3 in the embodiment shown in FIG. 13 in that the lamp unit 100-4 includes a protecting layer 140-1 formed of a light-transmitting molding member. The protecting layer 140-1 shown in FIG. 14 may be the same as the above-described protecting layer 140 except for the material of the protecting layer 140-1.

Figure 15:
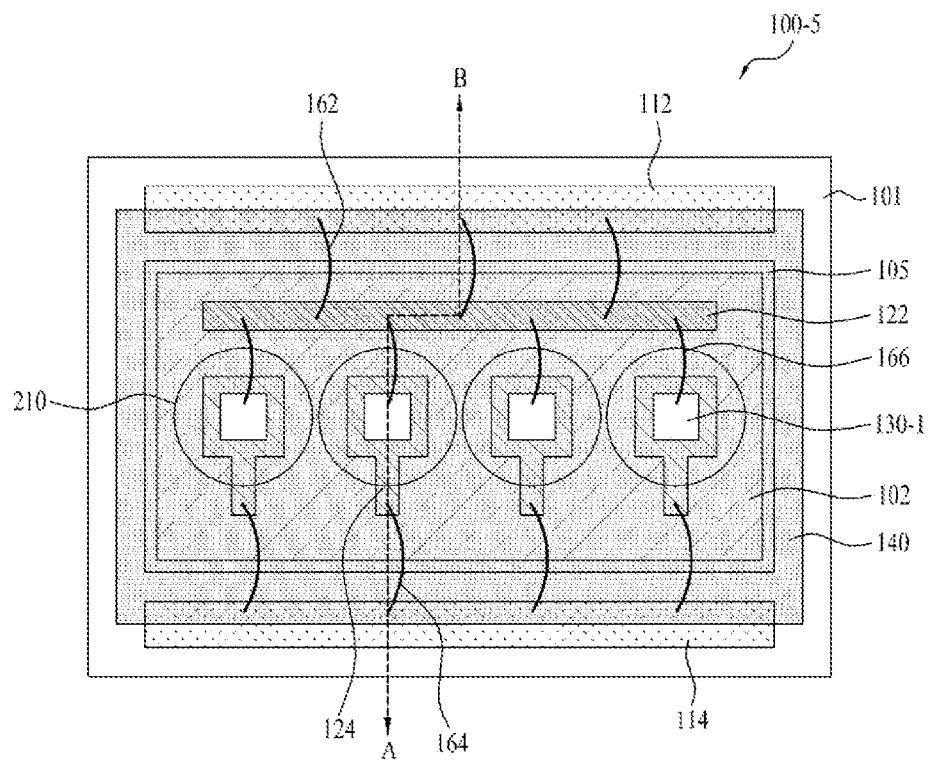
FIG. 15 is a plan view of a lamp unit in accordance with another embodiment.
Figure 16:
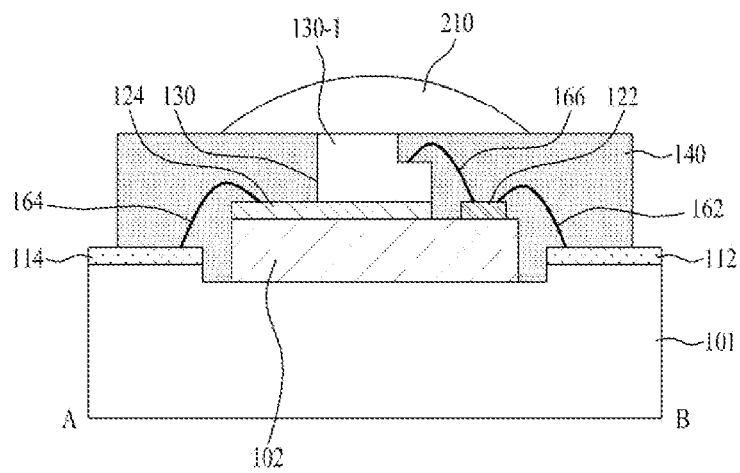
FIG. 16 is a cross-sectional view of the lamp unit shown in FIG. 15 taken along the line A-B.

FIG. 15 is a plan view of a lamp unit 100-5 in accordance with another embodiment, and FIG. 16 is a cross-sectional view of the lamp unit 100-5 shown in FIG. 15 taken along the line A-B.

With reference to FIGS. 15 and 16, the lamp unit 100-5 further includes lenses 210, in addition to the lamp unit 100-3 in accordance with the embodiment shown in FIG. 13.

The lenses 210 may be disposed on the protecting layer 140 so as to correspond to the light emitting device 130-1. The lenses 210 may refract light irradiated by the corresponding light emitting devices 130-1, and adjust a light path of the lamp unit 100-5.

Although FIG. 15 illustrates the lenses 210 as corresponding to the respective light emitting devices in FIG. 15 when the light emitting device 130-1 is plural in number, one lens (not shown) covering all the light emitting devices in FIG. 15 may be provided.

Figure 17:
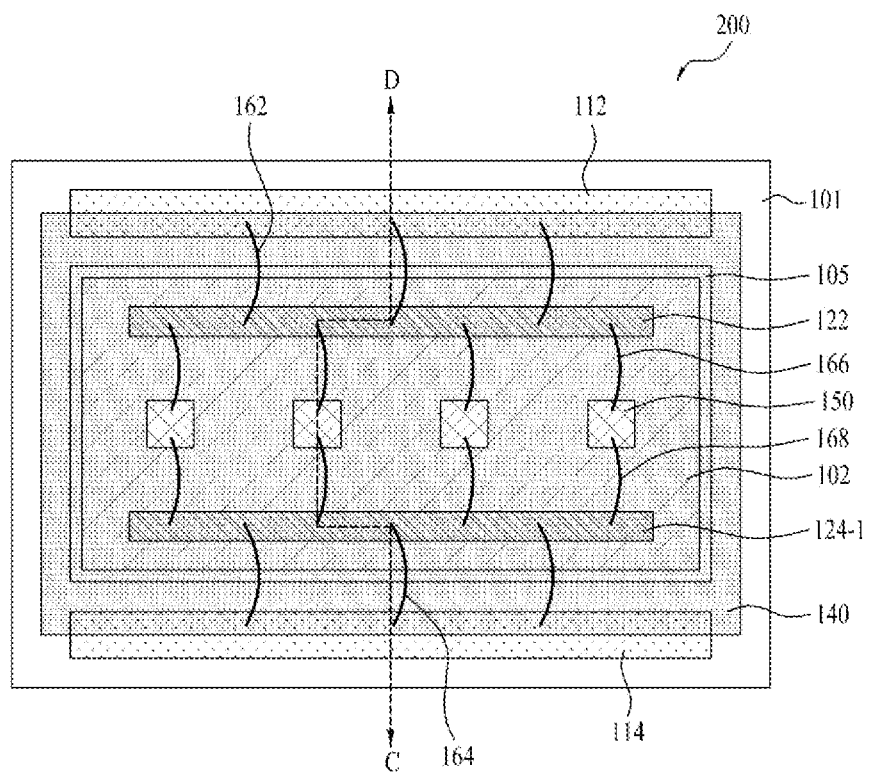
FIG. 17 is a plan view of a lamp unit in accordance with another embodiment.
Figure 18:
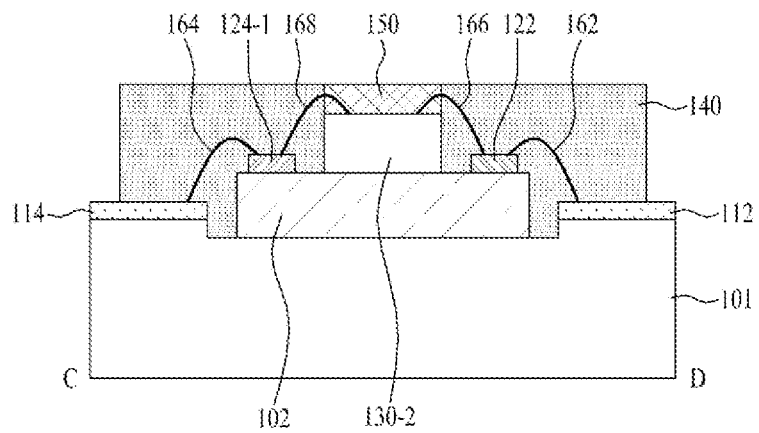
FIG. 18 is a cross-sectional view of the lamp unit shown in FIG. 17 taken along the line C-D.

FIG. 17 is a plan view of a lamp unit 200 in accordance with another embodiment, and FIG. 18 is a cross-sectional view of the lamp unit 200 shown in FIG. 17 taken along the line C-D. Elements in this embodiment which are substantially the same as those in the embodiment shown in FIGS. 1 and 2 are denoted by the same reference numerals even though they are depicted in different drawings, and a detailed description thereof will thus be briefly given or omitted because it is considered to be unnecessary.

With reference to FIGS. 17 and 18, the lamp unit 200, includes a first substrate 101, a second substrate 102, plural conductive layers 112, 114, 122, and 124-1, light emitting device 130-2, a protecting layer 140, a wavelength conversion layer 150, and plural wires 162, 164, 166, and 168.

The lamp unit 200 differs from the lamp unit 100 in the embodiment shown in FIG. 2 in that the light emitting device 130-2 is lateral light emitting diode, and the light emitting device 130-2 is electrically connected to the conductive layers 112, 114, 122, and 124-1.

When the light emitting device 130-2 is plural in number, the light emitting devices in FIG. 17 may be disposed on the second substrate 102.

Figure 30:
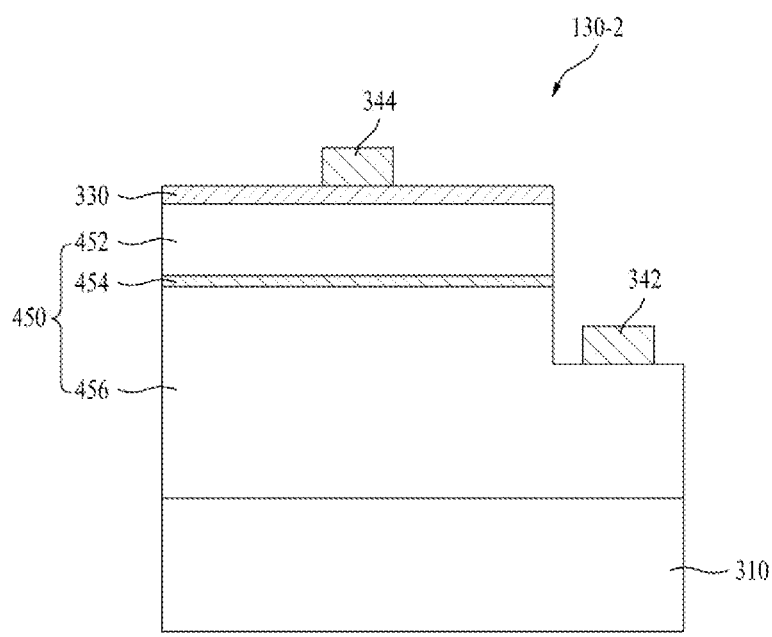
FIG. 30 is a view illustrating one embodiment of a light emitting device shown in FIG. 18.

FIG. 30 is a view illustrating one embodiment of the light emitting device 130-2 shown in FIG. 18.

With reference to FIG. 30, the light emitting device 130-2 includes a substrate 310, a light emitting structure 320, a conductive layer 330, a first electrode 342, and a second electrode 344.

The substrate 310 may be formed of a material proper for semiconductor material growth, i.e., a carrier wafer. Further, the substrate 310 may be formed of a material having high thermal conductivity, and be a conductive substrate or an insulating substrate. For example, the substrate 310 may be formed of a material including at least one of sapphire ($Al_2O_3$), GaN, SiC, ZnO, Si, GaP, InP, $Ga_2O_3$, and GaAs. A concave-convex pattern may be formed on the upper surface of the substrate 310.

Further, a layer or a pattern using a compound semiconductor of group II to VI atoms, for example, at least one of a ZnO layer (not shown), a buffer layer (not shown), and an undoped semiconductor layer (not shown), may be formed on the substrate 310. The buffer layer or the undoped semiconductor layer may be formed using a compound semiconductor of group III-V atoms, the buffer layer may reduce a difference of lattice constants with the substrate 310, and the undoped semiconductor layer may be formed of an undoped GaN-based semiconductor.

The light emitting structure 450 may be a semiconductor layer generating light, and include a first semiconductor layer 456, an active layer 454, and a second semiconductor layer 452. The first semiconductor layer 456, the active layer 454, and the second semiconductor layer 452 may be the same as those in the embodiment shown in FIG. 28. The light emitting device 130-2 may emit one of blue light, green light, red light, and yellow light.

In the light emitting structure 450, a portion of the semiconductor layer 456 may be exposed by removing the second semiconductor layer 452, the active layer 454 and the other portion of the semiconductor layer 456.

The conductive layer 330 reduces total reflection and has high light transmittance, and may thus increase extraction efficiency of light emitted from the active layer 454 to the second semiconductor layer 452.

The conductive layer 330 may be formed in a monolayer or multilayer structure using a transparent conductive oxide, for example, at least one selected from the group consisting of Indium Tin Oxide (ITO), Tin Oxide (TO), Indium Zinc Oxide (IZO), Indium Tin Zinc Oxide (ITZO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni, Ag, Ni/IrOx/Au, and Ni/IrOx/Au/ITO.

The first electrode 342 may be disposed on the exposed first semiconductor layer 456, and the second electrode 344 may be disposed on the conductive layer 330.

The first conductive layer 122 and the second conductive layer 124-1 may be located on the second substrate 102 so as to be separated from each other, and the light emitting device 130-2 may be electrically connected to the first conductive layer 122 and the second conductive layer 124-1.

The substrate 310 of the light emitting device 130-2 may be bonded to the second substrate 102.

The wire 166 may electrically connect the first electrode 342 of the light emitting device 130-2 to the first conductive layer 122 disposed on the second substrate 102. The wire 168 may electrically connect the second electrode 144 of the light emitting device 130-2 to the second conductive layer 124-1 disposed on the second substrate 102.

In order to protect the wires 166 and 168, the upper surface of the wavelength conversion layer 150 and the upper surface of the protecting layer 140 may be located at a position higher than the highest point T1 of each of the wires 166 and 168.

Figure 19:
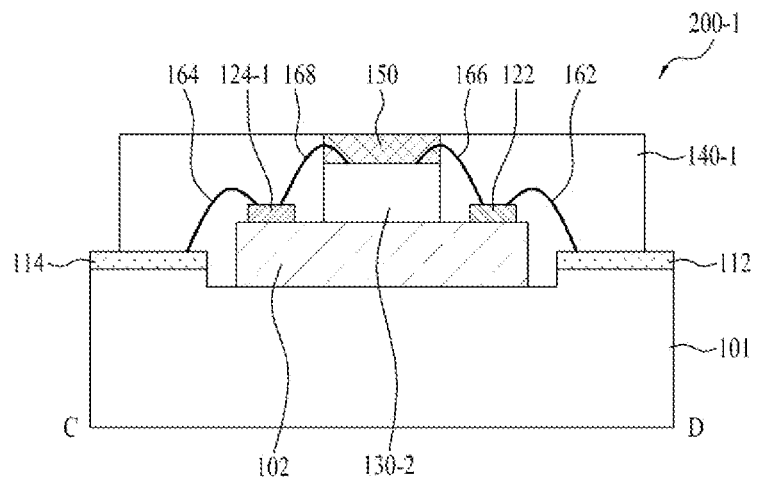
FIG. 19 is a cross-sectional view of a lamp unit in accordance with another embodiment.

FIG. 19 is a cross-sectional view of a lamp unit 200-1 in accordance with another embodiment. Elements in this embodiment which are substantially the same as those in the embodiment shown in FIG. 18 are denoted by the same reference numerals even though they are depicted in different drawings, and a detailed description thereof will thus be briefly given or omitted because it is considered to be unnecessary.

With reference to FIG. 19, the lamp unit 200-1 differs from the lamp unit 200 in the embodiment shown in FIG. 18 in that the protecting layer 140-1 transmits light.

Figure 20:
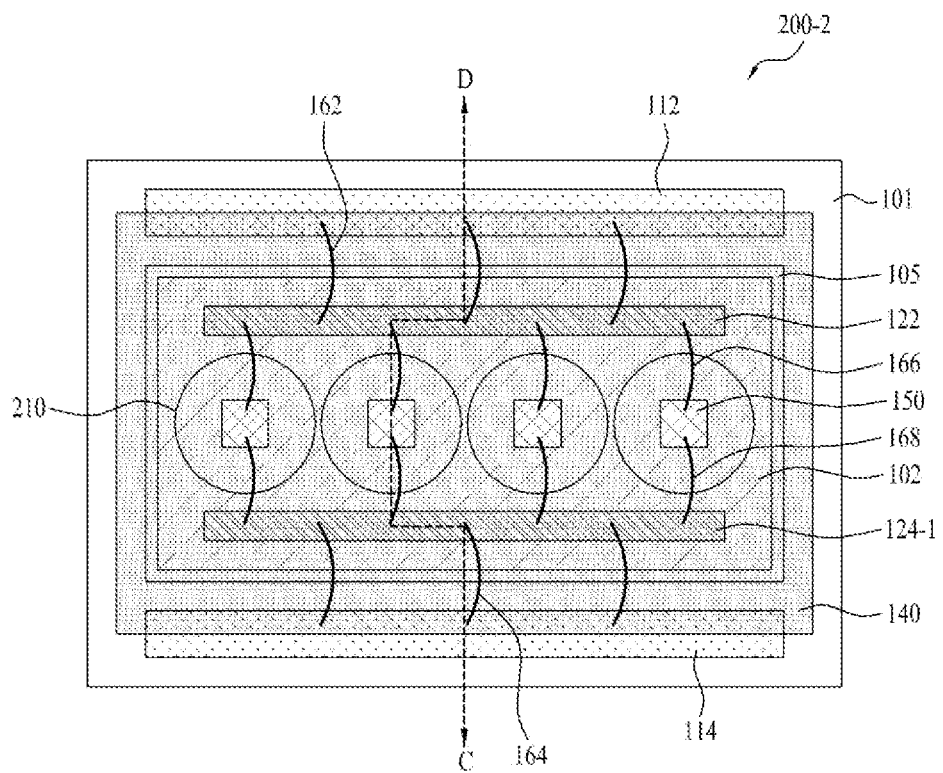
FIG. 20 is a plan view of a lamp unit in accordance with another embodiment.
Figure 21:
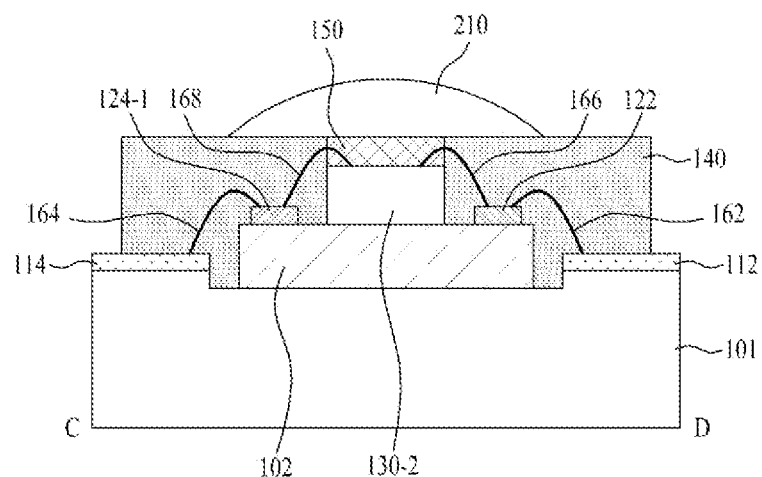
FIG. 21 is a cross-sectional view of the lamp unit shown in FIG. 20 taken along the line C-D.

FIG. 20 is a plan view of a lamp unit 200-2 in accordance with another embodiment, and FIG. 21 is a cross-sectional view of the lamp unit 200-2 shown in FIG. 20 taken along the line C-D. Elements in this embodiment which are substantially the same as those in the embodiment shown in FIG. 18 are denoted by the same reference numerals even though they are depicted in different drawings, and a detailed description thereof will thus be briefly given or omitted because it is considered to be unnecessary.

With reference to FIGS. 20 and 21, the lamp unit 200-2 further includes lenses 210, in addition to the lamp unit 200 in accordance with the embodiment shown in FIG. 18. The lenses 210 may be disposed on the wavelength conversion layer 150 and the protecting layer 140 so as to correspond to the light emitting device 130-2. The lenses 210 may refract light irradiated by the corresponding light emitting device 130-2, and adjust a light path of the lamp unit 200-2.

Figure 22:
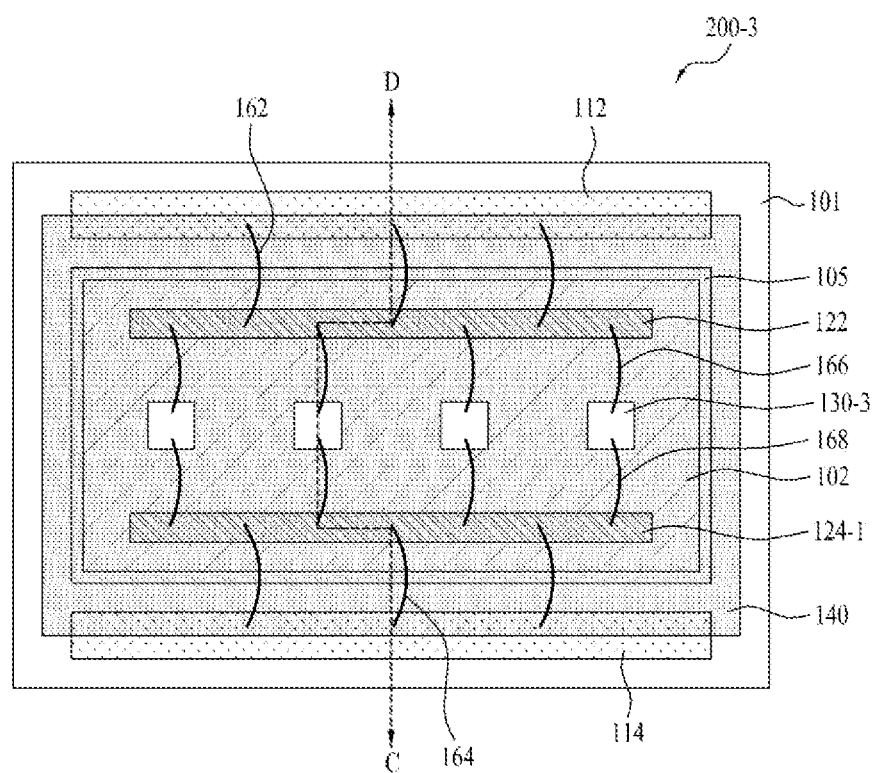
FIG. 22 is a plan view of a lamp unit in accordance with another embodiment.
Figure 23:
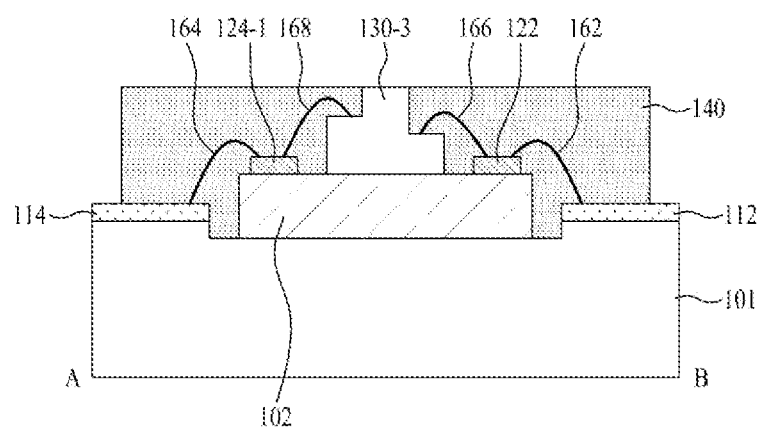
FIG. 23 is a cross-sectional view of the lamp unit shown in FIG. 22 taken along the line C-D.

FIG. 22 is a plan view of a lamp unit 200-3 in accordance with another embodiment, and FIG. 23 is a cross-sectional view of the lamp unit 200-3 shown in FIG. 22 taken along the line C-D. Elements in this embodiment which are substantially the same as those in the embodiment shown in FIGS. 17 and 18 are denoted by the same reference numerals even though they are depicted in different drawings, and a detailed description thereof will thus be briefly given or omitted because it is considered to be unnecessary.

With reference to FIGS. 22 and 23, the lamp unit 200-3 includes a first substrate 101, a second substrate 102, plural conductive layers 112, 114, 122, and 124-1, light emitting device 130-3, a protecting layer 140, and plural wires 162, 164, 166, and 168.

With reference to FIGS. 22 and 23, while the lamp unit 200 in the embodiment shown in FIG. 18 includes the chip-type light emitting device 130-2 and the wavelength conversion layer 150 located on the light emitting device 130-2, the lamp unit 200-3 includes the light emitting device 130-3, each of which is formed into one chip including the light emitting device 130-2 and the wavelength conversion unit 150 of the lamp unit 200 in the embodiment shown in FIG. 18.

For example, the light emitting device 130-2 may emit one of blue light, green light, red light, and yellow light, and the light emitting device 130-3 may emit white light.

Figure 31:
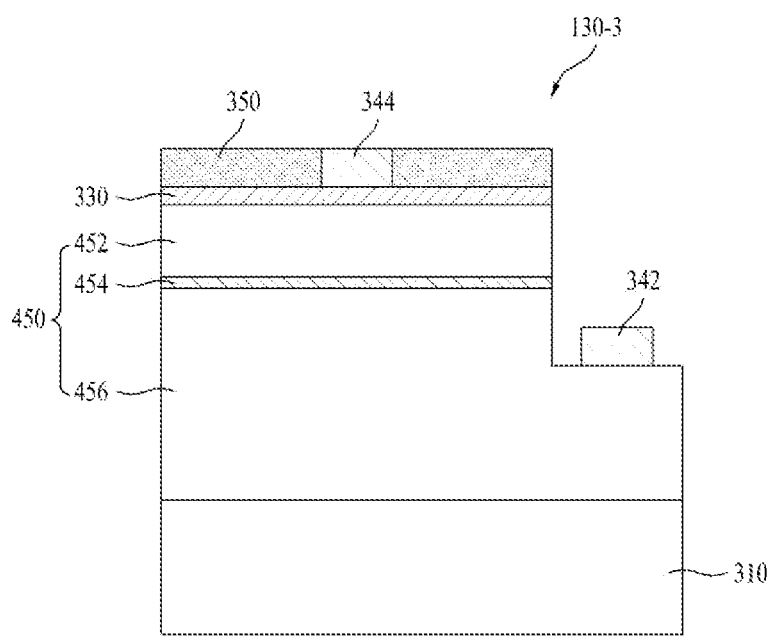
FIG. 31 is a view illustrating one embodiment of a light emitting device shown in FIG. 23.

FIG. 31 is a view illustrating one embodiment of the light emitting device 130-3 shown in FIG. 23. Elements in this embodiment which are substantially the same as those in the embodiment shown in FIG. 30 are denoted by the same reference numerals even though they are depicted in different drawings, and a detailed description thereof will thus be briefly given or omitted because it is considered to be unnecessary.

With reference to FIG. 31, the light emitting device 130-3 further includes a wavelength conversion layer 350.

The wavelength conversion layer 350 may be disposed on the second semiconductor layer 452, and expose the second electrode 344.

The upper surface of the protecting layer 140 may be coplanar with the upper surface of the light emitting device 130-3. That is, the height of the upper surface of the light emitting device 130-3 may be the same as the upper surface of the protecting layer 140. Here, the upper surface of the light emitting device 130-3 may be the upper surface of the wavelength conversion layer 350.

The protecting layer 140 may contact the side surface of the light emitting device 130-3, and the upper surface of the light emitting device 130-3 may be exposed from the protecting layer 140.

Since the height of the highest point of the wires 166 and 168 is lower than the height of the upper surface of the light emitting device 130-3 and the height of the upper surface of the protecting layer 140, breakage of and damage to the wires 166 and 168 may be prevented.

Figure 24:
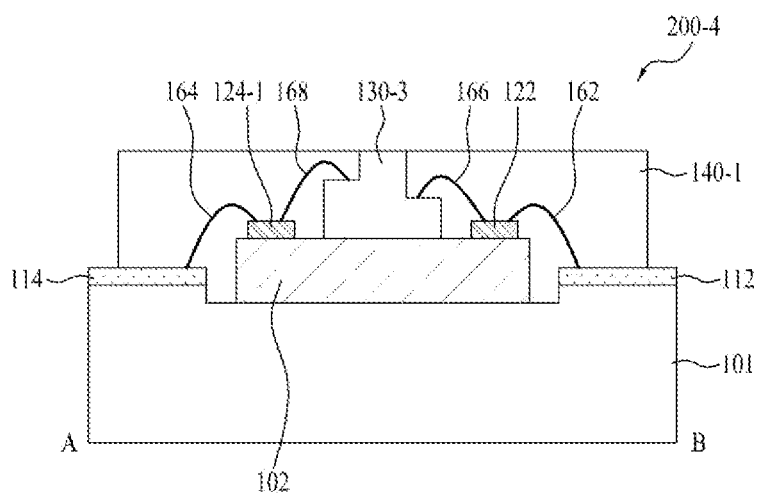
FIG. 24 is a cross-sectional view of a lamp unit in accordance with another embodiment.

FIG. 24 is a cross-sectional view of a lamp unit 200-4 in accordance with another embodiment. Elements in this embodiment which are substantially the same as those in the embodiment shown in FIG. 23 are denoted by the same reference numerals even though they are depicted in different drawings, and a detailed description thereof will thus be briefly given or omitted because it is considered to be unnecessary.

With reference to FIG. 24, while the protecting layer 140 of the lamp unit 200-3 shown in FIG. 23 is a reflective member, a protecting layer 140-1 of the lamp unit 200-4 may transmit light.

Figure 25:
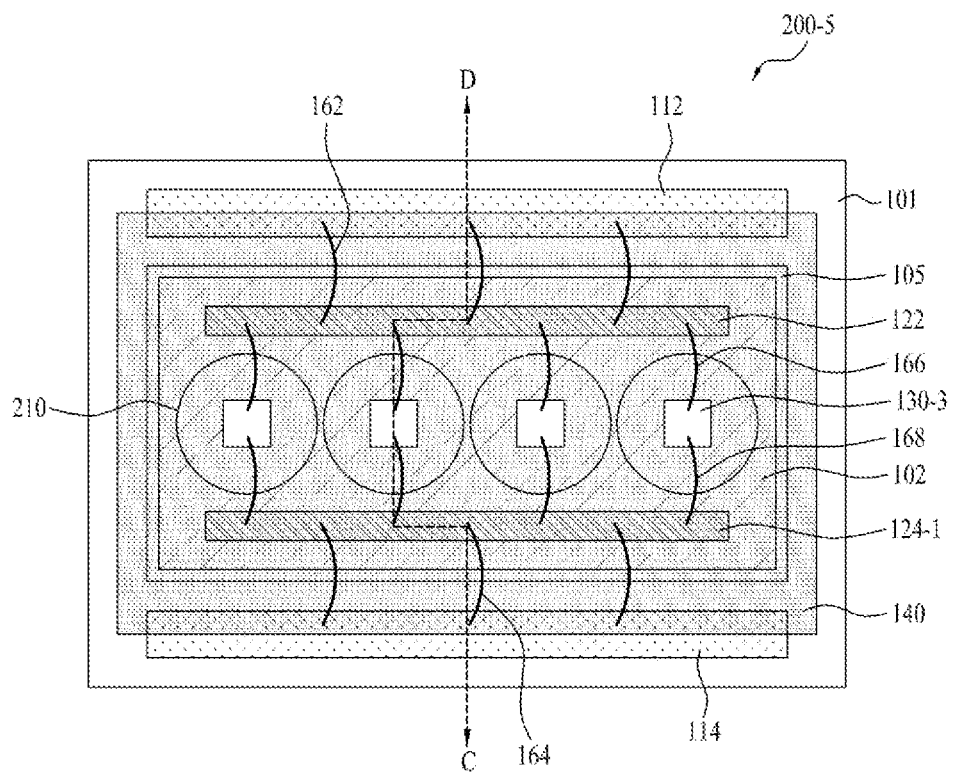
FIG. 25 is a plan view of a lamp unit in accordance with another embodiment.
Figure 26:
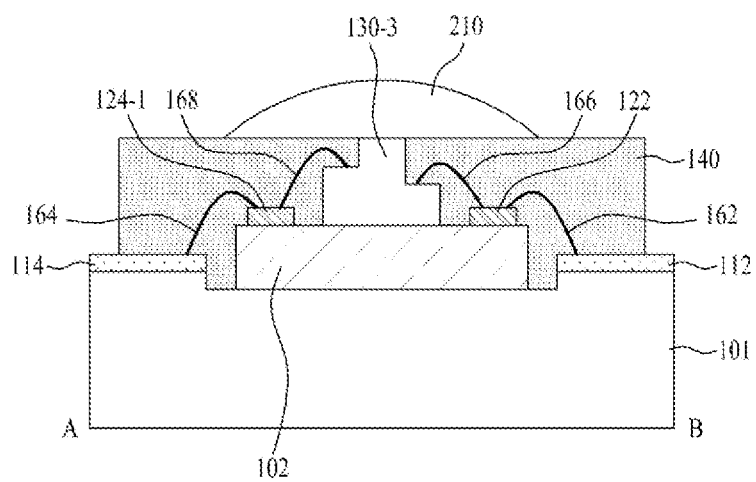
FIG. 26 is a cross-sectional view of the lamp unit shown in FIG. 25 taken along the line C-D.

FIG. 25 is a plan view of a lamp unit 200-5 in accordance with another embodiment, and FIG. 26 is a cross-sectional view of the lamp unit 200-5 shown in FIG. 25 taken along the line C-D.

Elements in this embodiment which are substantially the same as those in the embodiment shown in FIGS. 22 and 23 are denoted by the same reference numerals even though they are depicted in different drawings, and a detailed description thereof will thus be briefly given or omitted because it is considered to be unnecessary.

With reference to FIGS. 25 and 26, in order to refract light irradiated from the light emitting device 130-3 and adjust a light path, the lamp unit 200-5 may further include lenses 210, in addition to the lamp unit 200-3 in accordance with the embodiment shown in FIG. 23.

Figure 27:
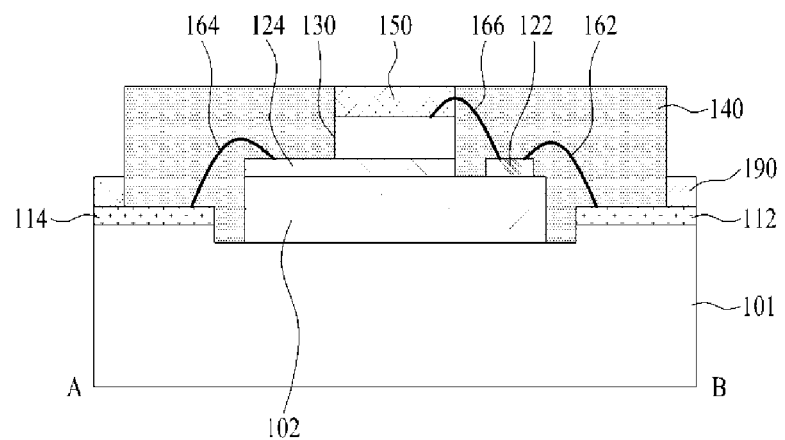
FIG. 27 is a cross-sectional view of a lamp unit in accordance with another embodiment.

FIG. 27 is a cross-sectional view of a lamp unit in accordance with another embodiment. The lamp unit in the embodiment shown in FIG. 27 is a modification of the lamp unit 100 shown in FIG. 1, and may further include a molding fixation unit 190.

With reference to FIG. 27, the molding fixation unit 190 may be disposed on the first substrate 101 and the plural conductive layers 112, 114, 122, and 124 so as to contact the outer circumferential surface of the protecting layer 140, and support and fix the edge of the protecting layer 140.

The molding fixation unit 190 may be disposed on the first substrate 101 and the plural conductive layers 112, 114, 122, and 124 so as to surround light emitting device 130, and the protecting layer 140 may be formed by discharging a molding member to the inside of the molding fixation unit 190 and hardening the discharged molding member. Here, the molding fixation unit 190 may prevent the discharged molding member from overflowing, and serve to support the protecting layer 140 after hardening.

The shape of the molding fixation unit 190 may be determined by the desired shape of the protecting layer 140. For example, the molding fixation unit 190 may have a circular shape, an oval shape, and a polygonal shape, such as a rectangle, but the disclosure is not limited thereto.

The molding fixation unit 190 may be additionally applied to the lamp units 100-2 to 100-5, 200, and 200-1 to 200-5 in accordance with other embodiments.

Figure 32:
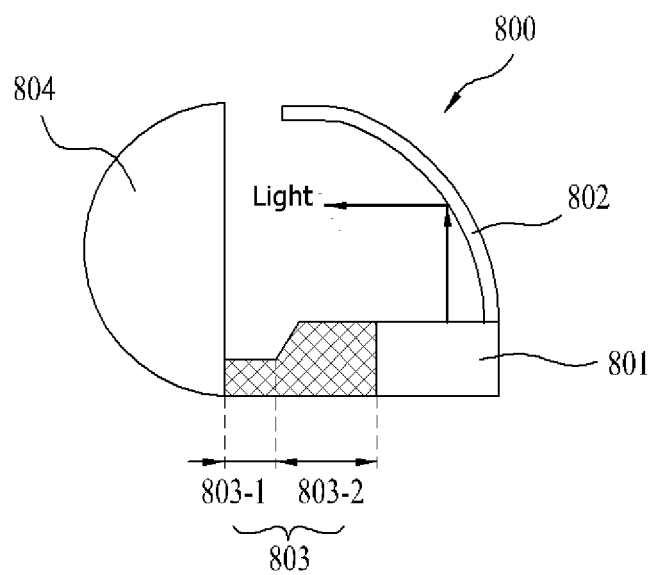
FIG. 32 is a cross-sectional of a headlamp for vehicles in accordance with one embodiment.

FIG. 32 is a cross-sectional view of a headlamp 800 for vehicles in accordance with one embodiment.

With reference to FIG. 32, the headlamp 800 includes a lamp unit 801, a reflector 802, a shade 803, and a lens 804.

The lamp unit 801 may be one of the above-described lamp units 100, 100-1 to 100-5, 200, and 200-1 to 200-5 in accordance with the embodiments, and generate light.

The reflector 802 may reflect light irradiated by the lamp unit 801 in a designated direction. The shade 803 may be disposed between the reflector 802 and the lens 804. The shade 803 is a member which blocks or reflects a portion of light reflected by the reflector 802 and proceeding to the lens 804 to form a light distribution pattern desired by a designer.

Here, one side 803-1 of the shade 803 adjacent to the lens 804 and the other side 803-2 of the shade 803 adjacent to the lamp unit 801 may have different heights.

Light irradiated by the lamp unit 801 may be reflected by the reflector 802 and the shade 803, pass through the lens 804, and then proceed to the front region of a vehicle. Here, the lens 804 may refract light reflected by the reflector 802.

Figure 33:
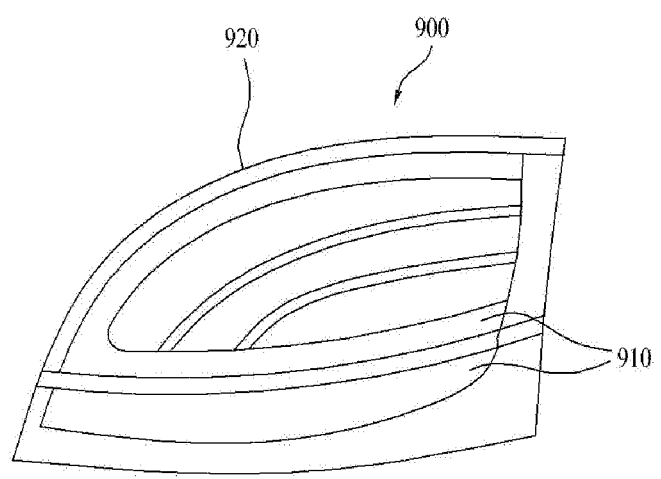
FIG. 33 is a view illustrating a headlamp for vehicles in accordance with another embodiment.

FIG. 33 is a view illustrating a headlamp 900 for vehicles in accordance with another embodiment.

With reference to FIG. 33, the headlamp 900 for vehicles may include a lamp unit 910 and a light housing 920

The lamp unit 910 may include at least one of the above-described lamp units 100, 100-1 to 100-5, 200, and 200-1 to 200-5 in accordance with the embodiments.

The light housing 920 may accommodate the lamp unit 910, and be formed of a light-transmitting material. The light housing 920 for vehicles may be curved according to a region or design of a vehicle on which the light housing 920 is mounted.

Each of the above-described headlamps 800 and 900 for vehicles includes a lamp unit in accordance with one embodiment, and may thus improve light efficiency.

As is apparent from the above description, a lamp unit in accordance with one embodiment may protect wires bonded to light emitting device and reduce light loss.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A lamp unit comprising:
a first substrate;
a second substrate provided over the first substrate;
a light emitting device provided over the second substrate;
a first conductive layer and a second conductive layer provided over the second substrate;
at least one wire to electrically couple at least one of the first conductive layer and the second conductive layer to the light emitting device; and
a protecting layer provided on the first substrate and the second substrate, and the protecting layer to surround the light emitting device and the at least one wire,
wherein an upper surface of the light emitting device is exposed from the protecting layer, and the upper surface of the protecting layer is provided at a position above a highest point of the at least one wire, wherein the protecting layer directly contacts a side surface of the light emitting device.

2. The lamp unit according to claim 1, wherein the protecting layer comprises a molding member for reflecting light.

3. The lamp unit according to claim 1, wherein the protecting layer comprises a light-transmitting molding member.

4. The lamp unit according to claim 1, wherein an upper surface of the light emitting device is coplanar with an upper surface of the protecting layer.

5. The lamp unit according to claim 1, wherein the light emitting device includes:
a light emitting structure including a first semiconductor layer, an active layer, and a second semiconductor layer, and the light emitting structure to provide light; and
a wavelength conversion layer disposed on the light emitting structure, and the wavelength conversion layer to convert a wavelength of light irradiated from the light emitting structure.

6. The lamp unit according to claim 5, wherein an upper surface of the wavelength conversion layer is coplanar with an upper surface of the protecting layer.

7. The lamp unit according to claim 1, wherein the first substrate is provided with a cavity, the second substrate is disposed within the cavity, and the protecting layer is provided in the cavity.

8. The lamp unit according to claim 1, further comprising:
a third conductive layer and a fourth conductive layer disposed on the first substrate;
first wires electrically connecting the first conductive layer to the third conductive layer; and
second wires electrically connecting the second conductive layer to the fourth conductive layer,
wherein the protecting layer surrounds the first wires and the second wires.

9. The lamp unit according to claim 1, further comprising lenses corresponding to the light emitting device and disposed on the protecting layer.

10. The lamp unit according to claim 1, wherein the first substrate comprises a metal core printed circuit board (MCPCB), and the second substrate comprises a ceramic substrate.

11. A lamp unit comprising:
a first substrate;
a second substrate provided over the first substrate;
at least one light emitting device provided over the second substrate;
a first conductive layer and a second conductive layer provided over the second substrate;
at least one wire to electrically couple at least one of the first conductive layer and the second conductive layer to the light emitting device;
a wavelength conversion layer provided over the light emitting device, and the wavelength conversion layer to convert wavelength of light irradiated by the light emitting device; and
a protecting layer provided over the first substrate and the second substrate so as to surround the light emitting device, the wavelength conversion layer, and the at least one wire,
wherein an upper surface of the wavelength conversion layer is exposed from the protecting layer, and an upper surface of the protecting layer is located at a position higher than a highest point of the at least one wire, and
wherein the protecting layer directly contacts a side surface of the light emitting device and a side surface of the wavelength conversion layer.

12. The lamp unit according to claim 11, wherein an upper surface of the wavelength conversion layer is located at a position higher than the highest point of the at least one wire.

13. The lamp unit according to claim 11, wherein the protecting layer comprises a molding member for reflecting light.

14. The lamp unit according to claim 11, wherein the protecting layer comprises a light-transmitting molding member.

15. The lamp unit according to claim 11, wherein:
the at least one light emitting device includes a light emitting structure including a first semiconductor layer, an active layer, and a second semiconductor layer, and the light emitting structure to provide light; and
the at least one light emitting device emits one of blue light, green light, red light, and yellow light.

16. The lamp unit according to claim 11, wherein the at least one light emitting device comprises a plurality of light emitting devices, which are separated from one another, and the wavelength conversion layer includes plural portions and each of the plural portions of the wavelength conversion layer is located so as to correspond to one of the plural light emitting devices.

17. The lamp unit according to claim 11, wherein a height from an upper surface of the light emitting device to the upper surface of the wavelength conversion layer is equal to or great than a height from the upper surface of the light emitting device to the upper surface of the protecting layer.

18. The lamp unit according to claim 11, wherein the upper surface of the wavelength conversion layer is curved.

19. The lamp unit according to claim 11, wherein the at least one light emitting device includes a plurality of light emitting devices that are separated from one another, and
wherein the wavelength conversion layer corresponds to a region formed by uniting first regions in which the plurality of light emitting devices are respectively located and the second region located between two neighboring light emitting devices and the wavelength conversion layer is formed in one body.

20. A lamp unit comprising:
a first substrate;
a second substrate disposed on the first substrate;
a light emitting device disposed on the second substrate;
a first conductive layer and a second conductive layer disposed on the second substrate;
at least one wire to electrically connect at least one of the first conductive layer and the second conductive layer to the light emitting device;
a wavelength conversion layer disposed on the light emitting device, and the wavelength conversion layer to convert wavelength of light irradiated by the light emitting device;
a protecting layer disposed on the first substrate and the second substrate so as to surround the light emitting device, the wavelength conversion layer, and the at least one wire; and
a lens corresponding to the light emitting device and disposed on the protecting layer and the wavelength conversion layer,
wherein an upper surface of the wavelength conversion layer is exposed from the protecting layer, and an upper surface of the protecting layer and the upper surface of the wavelength conversion layer are located at a position higher than a highest point of the at least one wire, and the protecting layer directly contacts a side surface of the light emitting device and a side surface of the wavelength conversion layer, wherein the upper surface of the wavelength conversion layer contacts the lens.

* * * * *